(12) United States Patent
Son et al.

(10) Patent No.: US 10,792,709 B2
(45) Date of Patent: Oct. 6, 2020

(54) MASK CLEANING METHOD AND MASK CLEANING APPARATUS FOR PERFORMING THE SAME

(71) Applicant: Samsung Display Co., Ltd., Yongin-si (KR)

(72) Inventors: Jinseok Son, Asan-si (KR); Myungkyu Kim, Cheonan-si (KR); Kyunghoon Chung, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 356 days.

(21) Appl. No.: 15/828,202

(22) Filed: Nov. 30, 2017

(65) Prior Publication Data

US 2018/0161825 A1 Jun. 14, 2018

(30) Foreign Application Priority Data

Dec. 13, 2016 (KR) .................. 10-2016-0169604

(51) Int. Cl.
*B08B 3/02* (2006.01)
*B08B 7/00* (2006.01)
*B08B 7/04* (2006.01)
*B08B 3/08* (2006.01)
*C23C 14/04* (2006.01)
(Continued)

(52) U.S. Cl.
CPC ............... *B08B 3/024* (2013.01); *B08B 3/08* (2013.01); *B08B 7/0042* (2013.01); *B08B 7/0057* (2013.01); *B08B 7/04* (2013.01); *C23C 14/042* (2013.01); *H01L 51/0011* (2013.01);
(Continued)

(58) Field of Classification Search
CPC ..... B08B 7/0042; B08B 7/005; B08B 7/0057; B08B 15/04; B08B 3/024; B08B 3/08; B08B 7/04; B08B 3/02; H01L 51/0011; H01L 51/5287; H01L 51/56; C23C 14/042; H05B 33/10
See application file for complete search history.

(56) References Cited

U.S. PATENT DOCUMENTS 8,709,163 B2 4/2014 Kim et al.
2007/0023065 A1* 2/2007 Kim .................. B08B 5/02
134/1.2
(Continued)

FOREIGN PATENT DOCUMENTS

JP 2011-072921 4/2011
KR 10-2002-0083578 11/2002
(Continued)

*Primary Examiner* — Robert J Scruggs
(74) *Attorney, Agent, or Firm* — H.C. Park & Associates, PLC

(57) ABSTRACT

A mask cleaning apparatus and method of using the same includes a preheating zone preheating a mask, a first ultraviolet cleaning zone irradiating the mask with a first ultraviolet laser beam at a first irradiation angle, a first cooling zone cooling the mask irradiated with the first ultraviolet laser beam, a second ultraviolet cleaning zone irradiating the mask with a second ultraviolet laser beam at a second irradiation angle, a second cooling zone cooling the mask irradiated with the second ultraviolet laser beam, an infrared cleaning zone irradiating the mask with an infrared laser beam at a third irradiation angle, and a peeling zone spraying air onto the mask irradiated with the infrared laser beam.

14 Claims, 12 Drawing Sheets

(51) Int. Cl.
  *H05B 33/10* (2006.01)
  *H01L 51/52* (2006.01)
  *H01L 51/56* (2006.01)
  *H01L 51/00* (2006.01)

(52) U.S. Cl.
  CPC .......... *H01L 51/5287* (2013.01); *H01L 51/56* (2013.01); *H05B 33/10* (2013.01)

(56) References Cited

U.S. PATENT DOCUMENTS

| | | | |
|---|---|---|---|
| 2008/0230101 A1* | 9/2008 | Hayashi | B08B 3/08 134/57 R |
| 2009/0032068 A1* | 2/2009 | Stein | H01L 21/67034 134/30 |
| 2009/0107531 A1* | 4/2009 | Kuge | B08B 3/022 134/153 |
| 2011/0197920 A1* | 8/2011 | Kenowski | B08B 9/027 134/10 |
| 2016/0150935 A1* | 6/2016 | Kunnas | B08B 3/041 134/9 |

FOREIGN PATENT DOCUMENTS

| KR | 10-0626037 | 9/2006 |
|---|---|---|
| KR | 10-1195565 | 10/2012 |

* cited by examiner

FIG. 1
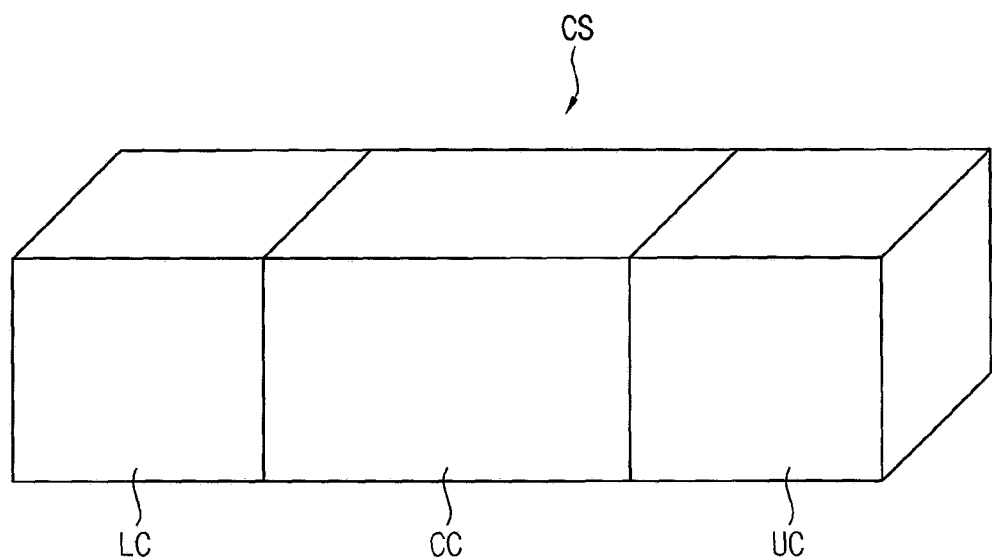
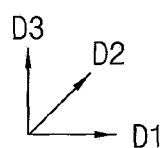

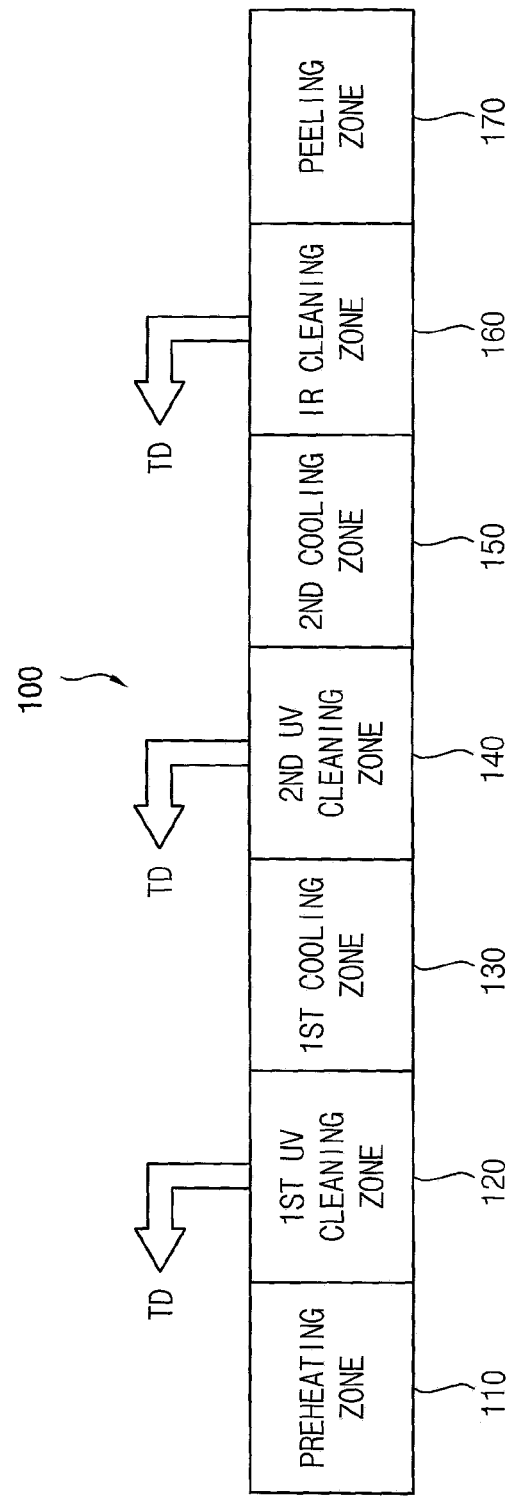

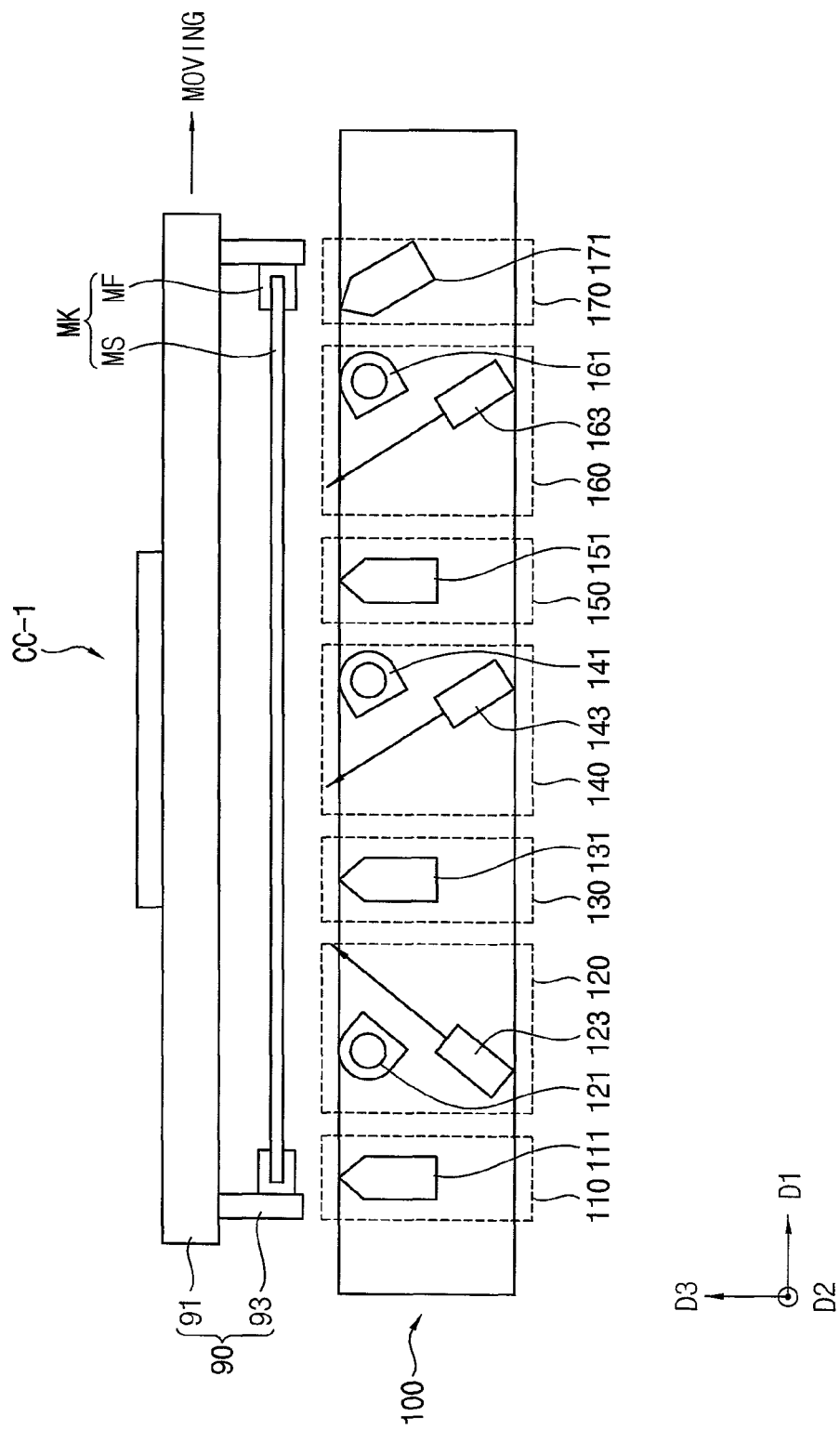

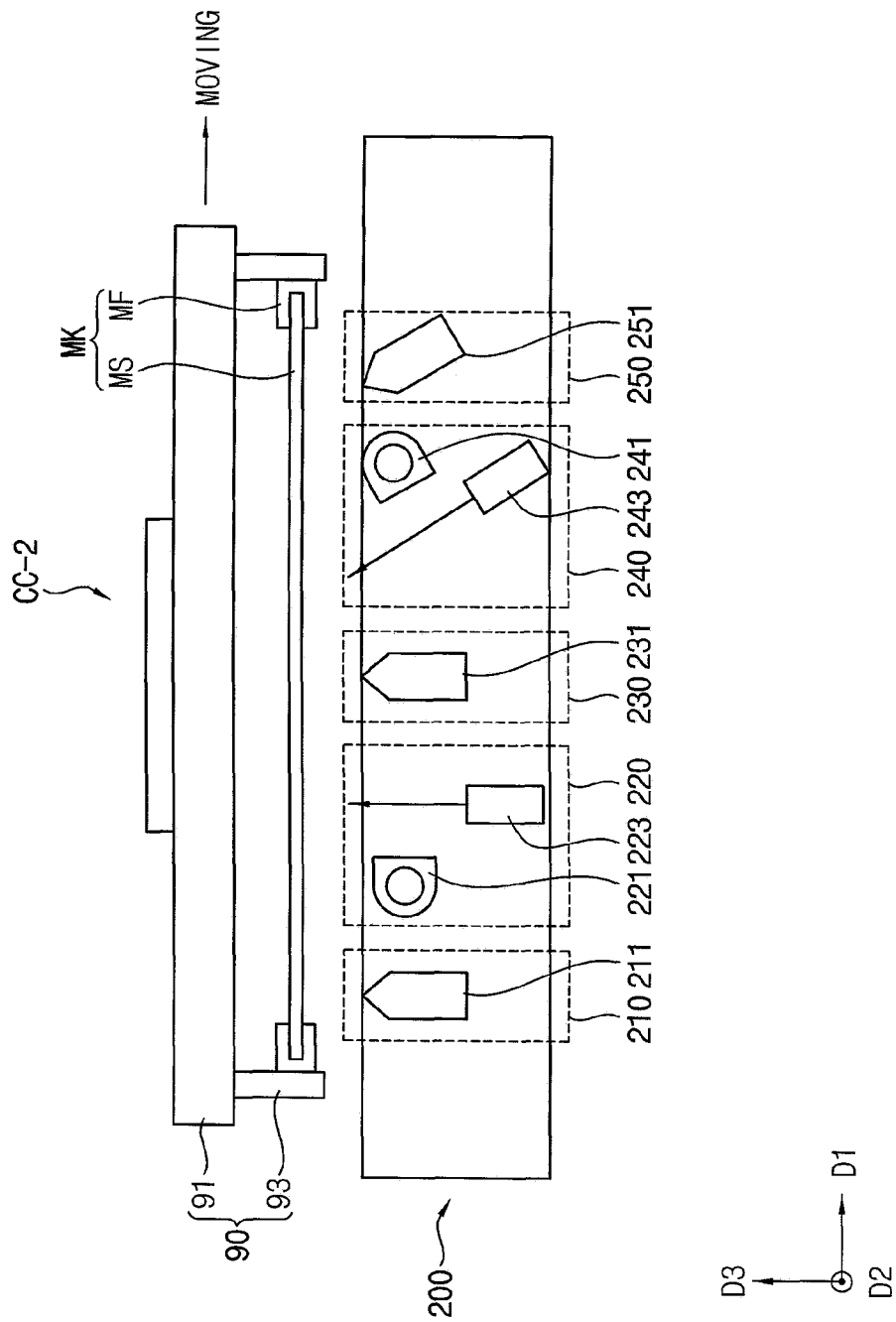

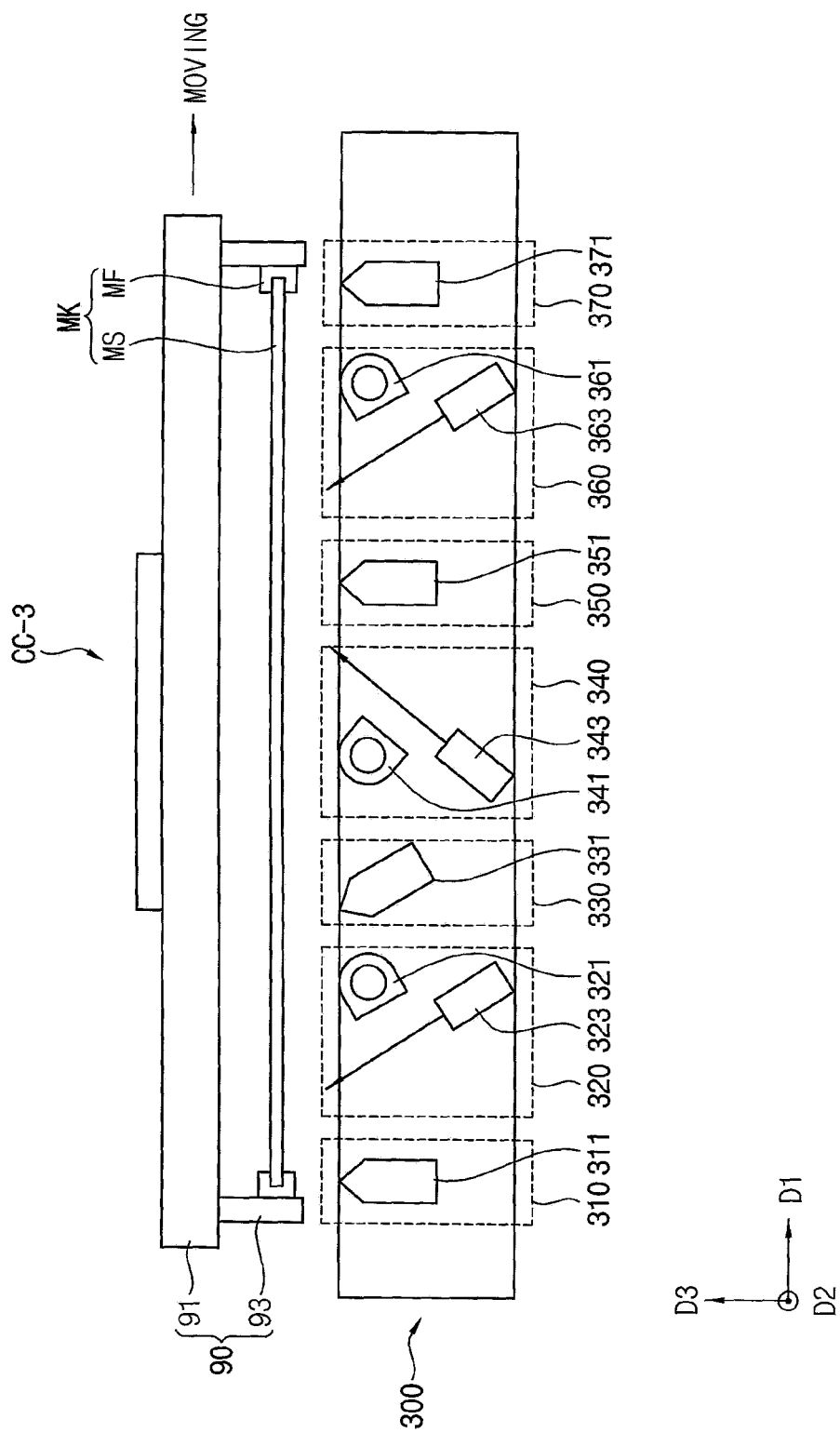

MASK CLEANING METHOD AND MASK CLEANING APPARATUS FOR PERFORMING THE SAME

CROSS REFERENCE TO RELATED APPLICATION

This application claims priority from and the benefit of Korean Patent Application No. 10-2016-0169604 filed on Dec. 13, 2016, which is hereby incorporated by reference for all purposes as if fully set forth herein.

BACKGROUND

Field

Exemplary embodiments relate to an apparatus for manufacturing display devices. More particularly, exemplary embodiments relate to a mask cleaning method and a mask cleaning apparatus for performing the method.

Discussion of the Background

In general, an organic light emitting display device may include organic light emitting diodes (OLEDs) to display an image. In OLED, holes and electrons respectively injected from an anode and a cathode recombine at an emission layer to emit light. The OLED has a stacked structure that includes two electrodes (i.e., the anode and the cathode), and the emission layer interposed between the anode and the cathode. However, because it may be difficult to achieve higher light emission efficiency using this structure, intermediate layers such as an electron injection layer (EIL), an electron transport layer (ETL), a hole transport layer (HTL), and a hole injection layer (HIL) may be additionally interposed between the emission layer and each of the electrodes.

A fine pattern of an organic thin film (e.g., the emission layer) may be formed by a deposition method. The deposition method includes placing a mask having the same pattern as a thin film to be formed in close contact with a surface of a substrate on which an organic thin film is to be formed, and depositing a thin film material on the substrate through the mask to form the thin film having the desired pattern.

Within a deposition chamber used to deposit the finely patterned organic thin film, devices that include the mask are subjected to preventive maintenance (PM) on a regular cycle when the deposition process is repeatedly performed. In a process of manufacturing organic light emitting display devices using a fine metal mask (FMM), the FMM may be separated for cleaning according to a predetermined PM cycle (e.g., after every 80 depositions on the substrate).

The above information disclosed in this Background section is only for enhancement of understanding of the background of the disclosure, and, therefore, it may contain information that does not form the prior art that is already known in this country to a person of ordinary skill in the art.

SUMMARY

Exemplary embodiments provide a mask cleaning apparatus performing dry cleaning to a screen mask for manufacturing display devices.

Exemplary embodiments provide a mask cleaning method using the mask cleaning apparatus.

Additional aspects will be set forth in the detailed description which follows, and, in part, will be apparent from the disclosure, or may be learned by practice of the disclosure.

According to exemplary embodiments, a mask cleaning apparatus may include a preheating zone configured to preheat a mask, a first ultraviolet cleaning zone configured to irradiate the mask with a first ultraviolet laser beam at a first irradiation angle, a first cooling zone configured to cool the mask irradiated with the first ultraviolet laser beam, a second ultraviolet cleaning zone configured to irradiate the mask with a second ultraviolet laser beam at a second irradiation angle, a second cooling zone configured to cool the mask irradiated with the second ultraviolet laser beam, an infrared cleaning zone configured to irradiate the mask with an infrared laser beam at a third irradiation angle, and a peeling zone configured to spray air onto the mask irradiated with the infrared laser beam.

In exemplary embodiments, the mask cleaning apparatus may be configured such that the mask may sequentially pass through the preheating zone, the first ultraviolet cleaning zone, the first cooling zone, the second ultraviolet cleaning zone, the second cooling zone, the infrared cleaning zone, and the peeling zone at a constant speed.

In exemplary embodiments, the first irradiation angle and the second irradiation angle may be symmetrical to each other.

In exemplary embodiments, the mask cleaning apparatus may be configured such that at least one of intensity, irradiation angle, and irradiation direction of the second ultraviolet laser beam may be adjusted based on a characteristic of the mask.

In exemplary embodiments, the mask cleaning apparatus may be configured such that an intensity of the second ultraviolet laser beam may be smaller than an intensity of the first ultraviolet laser beam.

In exemplary embodiments, the preheating zone may include a first air knife configured to spray air onto the mask. The first cooling zone may include a second air knife configured to spray air onto the mask. The second cooling zone may include a third air knife configured to spray air onto the mask. The first air knife, the second air knife, and the third air knife may be configured such that a first temperature of air sprayed from the first air knife may be higher than a second temperature of air sprayed from the second air knife and a third temperature of air sprayed from the third air knife.

In exemplary embodiments, the peeling zone may include a fourth air knife configured to spray air onto the mask. A spray angle of the fourth air knife may be smaller than spray angles of the first air knife, the second air knife, and the third air knife.

In exemplary embodiments, each of the first ultraviolet cleaning zone, the second ultraviolet cleaning zone, and the infrared cleaning zone may include a suction device.

In exemplary embodiments, the suction device may be connected to a collecting device for collecting organic material.

In exemplary embodiments, the mask may include a mask sheet and a mask frame. Each of irradiation directions of the first and second ultraviolet laser beams may be determined based on a position of the mask sheet. An irradiation direction of the infrared laser beam may be determined based on a position of the mask frame.

According to exemplary embodiments, a mask cleaning apparatus may include an ultraviolet cleaning zone configured to irradiate a mask with an ultraviolet laser beam, an infrared cleaning zone configured to irradiate the mask with an infrared laser beam, and a peeling zone configured to spray air onto the mask. The mask cleaning apparatus may be configured such that the mask may sequentially pass through the ultraviolet cleaning zone, the infrared cleaning zone, and the peeling zone at a constant speed.

In exemplary embodiments, the mask cleaning apparatus may further include a preheating zone including a first air knife configured to spray air onto the mask, and a cooling zone including a second air knife configured to spray air onto the mask irradiated with the ultraviolet laser beam. The mask cleaning apparatus may be configured such that a first temperature of air sprayed from the first air knife may be higher than a second temperature of air sprayed from the second air knife.

In exemplary embodiments, the peeling zone may include a fourth air knife configured to spray air onto the mask. A spray angle of the fourth air knife may be smaller than spray angles of the first air knife and the second air knife.

In exemplary embodiments, a first irradiation angle of the ultraviolet laser beam may be larger than a second irradiation angle of the infrared laser beam.

In exemplary embodiments, the mask cleaning apparatus may be configured such that the ultraviolet laser beam may be irradiated perpendicularly to the mask.

According to exemplary embodiments, a mask cleaning method may include an operation of preheating a mask using a first air knife, an operation of irradiating the mask with a first ultraviolet laser beam at a first irradiation angle, an operation of cooling the mask using a second air knife, an operation of irradiating the mask with a second ultraviolet laser beam at a second irradiation angle, an operation of cooling the mask using a third air knife, an operation of irradiating the mask with a infrared laser beam at a third irradiation angle, and an operation of spraying air onto the mask using a fourth air knife.

In exemplary embodiments, the first irradiation angle and the second irradiation angle may be symmetrical to each other.

In exemplary embodiments, an intensity of the second ultraviolet laser beam may be smaller than an intensity of the first ultraviolet laser beam.

In exemplary embodiments, a spray angle of the fourth air knife may be smaller than spray angles of the first air knife, the second air knife, and the third air knife.

In exemplary embodiments, a temperature of air sprayed from the first air knife may be higher than a temperature of air sprayed from the second air knife and a temperature of air sprayed from the third air knife.

Therefore, a mask cleaning apparatus according to exemplary embodiments may clean a screen mask for manufacturing display devices in a dry cleaning manner by including at least one ultraviolet cleaning zone in which the mask is irradiated with an ultraviolet laser beam and an infrared cleaning zone in which the mask is irradiated with an infrared laser beam. Accordingly, the mask cleaning apparatus can be implemented with a simpler structure as compared to a wet cleaning apparatus. Also, the mask cleaning apparatus can reduce a cost of chemical material, and can clean the mask regardless of mask type, mask size, type of organic material, etc. As a result, the mask cleaning apparatus can reduce the manufacturing cost including initial investment cost, maintenance cost, operation cost, etc., of the display device. In addition, the mask cleaning apparatus can reduce the likelihood or extent of damage to the mask during cleaning process, thereby increasing the quality of the display device to manufacture of a higher resolution display device.

Since a mask cleaning method according to exemplary embodiments does not use a chemical solvent (e.g., organic solvent, alkaline solvent, etc) used in the wet cleaning manner, environmental safety can be improved.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the disclosure, and are incorporated in and constitute a part of this specification, illustrate exemplary embodiments, and, together with the description, serve to explain principles of the disclosure.

FIG. 1 is block diagram illustrating a mask cleaning system according to exemplary embodiments.

FIG. 2A is a schematic diagram of a mask cleaning apparatus according to a first exemplary embodiment.

FIG. 2B is a more detailed schematic diagram of the first exemplary embodiment of a mask cleaning apparatus.

FIG. 5B is a more detailed schematic diagram of the second exemplary embodiment of a mask cleaning apparatus.

FIG. 7B is a more detailed schematic diagram of the third exemplary embodiment of a mask cleaning apparatus.

DETAILED DESCRIPTION OF THE ILLUSTRATED EMBODIMENTS

Figure 3:
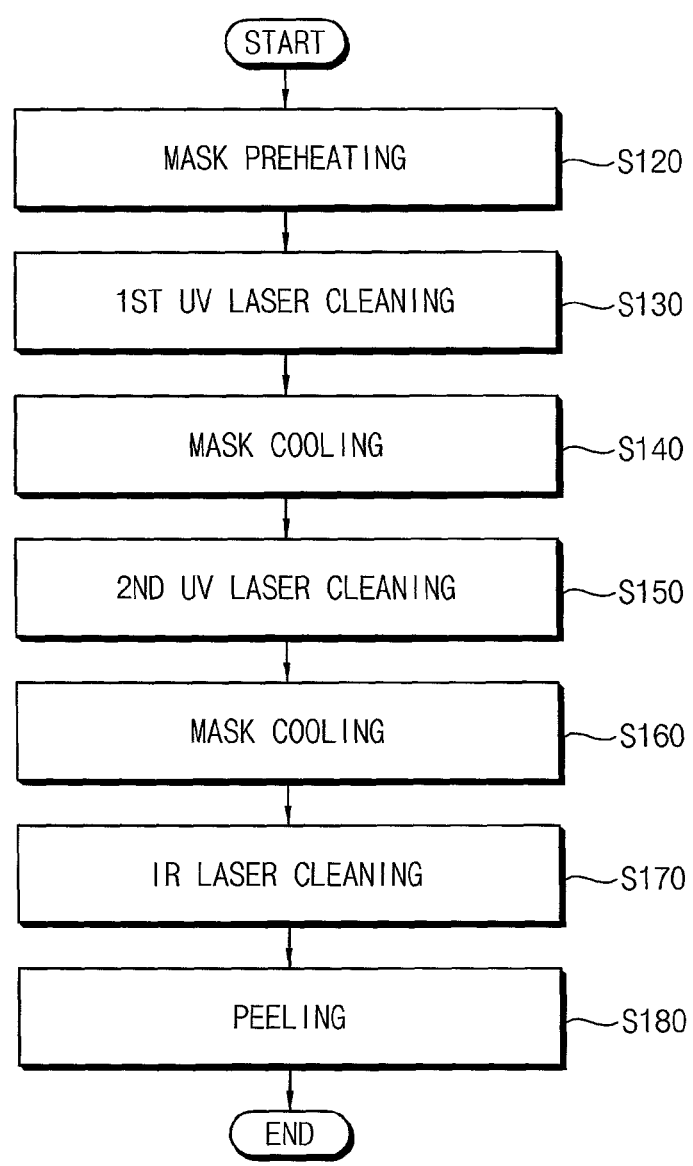
FIG. 3 is a flow chart of an example of a mask cleaning method using the mask cleaning apparatus of FIGS. 2A and 2B.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Referring to FIG. 1, the mask cleaning system CS may include a loading chamber LC, a cleaning chamber CC, and an unloading chamber UC. The loading chamber LC, the cleaning chamber CC, and the unloading chamber UC may be arranged in a line and may clean a mask on which deposition materials (e.g., organic materials, etc) are deposited in a line manner. Here, the mask may be for manufacturing a display device. For example, the mask may be a fine metal mask (FMM), an open mask, or the like for manufacturing an organic light emitting display device.

The loading chamber LC may load the mask to be subjected to dry cleaning. For example, in the loading chamber LC, the mask is loaded on the stage such that a deposition surface of the mask on which the deposition material is deposited faces the ground (i.e., an opposite direction to the arrow of the third direction D3). The stage on which the mask is loaded may be accelerated to reach a desired target speed in a first direction D1.

The cleaning chamber CC may include a mask cleaning apparatus for performing dry cleaning to the mask. The stage on which the mask is loaded may pass through the cleaning chamber CC in the first direction D1 at constant target speed.

The mask cleaning apparatus of the cleaning chamber CC may include one or more ultraviolet cleaning zones in which the mask is irradiated with an ultraviolet laser beam and an infrared cleaning zone in which the mask is irradiated with an infrared laser beam, thereby cleaning the screen mask for manufacturing display devices in a dry cleaning manner. Hereinafter, a structure of the mask cleaning apparatus will be described in more detail with reference to the FIGS. 2A, 2B, 5A, 5B, 7A, and 7B.

The unloading chamber UC may unload the mask after the dry cleaning is completed.

Although the exemplary embodiments of FIG. 1 describe that the mask cleaning system CS includes the loading chamber LC, the cleaning chamber CC, and the unloading chamber UC, other embodiments are also possible. For example the mask cleaning system may load and clean the mask in one chamber.

Referring to FIGS. 2A, 2B, and 3, the mask cleaning apparatus 100 may clean the mask MK in dry cleaning manner by including first and second ultraviolet cleaning zones 120, 140 in each of which the mask is irradiated with an ultraviolet laser beam and an infrared cleaning zone 160 in which the mask is irradiated with an infrared laser beam.

The mask cleaning apparatus 100 of the cleaning chamber CC-1 may include a preheating zone 110, a first ultraviolet cleaning zone 120, a first cooling zone 130, a second ultraviolet cleaning zone 140, a second cooling zone 150, an infrared cleaning zone 160, and a peeling zone 170. In one exemplary embodiment, the mask MK may sequentially pass through the preheating zone 110, the first ultraviolet cleaning zone 120, the first cooling zone 130, the second ultraviolet cleaning zone 140, the second cooling zone 150, the infrared cleaning zone 160, and the peeling zone 170 at a constant speed (i.e., at a target speed).

For example, the mask MK may be loaded on the stage 90 including a supporting member 91 and a fixing member 93. The stage 90 on which the mask MK is loaded may pass through the cleaning chamber CC-1 at the constant speed such that the ultraviolet laser beams and the infrared laser beam are uniformly irradiated to the entire mask MK.

In the preheating zone 110, the mask MK may be preheated (S120). In one exemplary embodiment, the preheating zone 110 may include a first air knife 111 spraying air onto the mask MK. Here, the term air knife represents an air injector having various structures for spraying air onto the mask MK. In one exemplary embodiment, a first temperature of air sprayed from the first air knife 111 may be higher than a second temperature of air sprayed from a second air knife 131 included in the first cooling zone 130 and a third temperature of air sprayed from a third air knife 151 included in the second cooling zone 150. For example, the first air knife 111 may spray air at about 50 degrees Celsius to 90 degrees Celsius to the mask MK at a flow rate of about 800 LPM (liter per minute) to 1200 LPM. Accordingly, the preheating zone 110 may preheat the mask MK to weaken a binding force of the organic material deposited on the mask MK and to prevent particle scattering.

In the first ultraviolet cleaning zone 120, a first ultraviolet cleaning operation may be performed (S130). The first ultraviolet cleaning operation may irradiate the mask MK with a first ultraviolet laser beam at a first irradiation angle. In one exemplary embodiment, the first ultraviolet cleaning zone 120 may include a first suction device 121 and a first ultraviolet laser device 123. The first ultraviolet laser device 123 may irradiate a deposition surface of the mask MK with the first ultraviolet laser beam having a first irradiation angle, a first irradiation direction, and a first intensity to remove the organic material deposited on the deposition surface of the mask MK. Here, the irradiation angle represents an angle formed by the laser beam and a D1-D2 plane defined in the first direction D1 and the second direction D2. The irradiation direction represents an angle formed by the laser beam and a D1-D3 plane defined in the first direction D1 and the third direction D3. For example, the first irradiation angle may be between about 25 degrees and 65 degrees. The first suction device 121 may inhale and discharge the organic material separated from the mask MK by the first ultraviolet laser device 123.

In the first cooling zone 130, the mask MK heated by the first ultraviolet laser beam may be cooled (S140). A temperature of the mask MK may be raised depending on the intensity of the first ultraviolet laser beam, and this may cause deformation of the mask MK. In particular, since a fine mask for manufacturing a higher resolution display device is sensitive to deformation, it may be beneficial to cool the mask down rapidly to increase the manufacturing yield of the display device. In one exemplary embodiment, the first cooling zone 130 may include a second air knife 131 spraying air onto the mask MK. The second temperature of air sprayed from the second air knife 131 may be lower than the first temperature of air sprayed from the first air knife 111. For example, the second air knife 131 may spray ambient temperature (for example, about 10 degrees Celsius to 20 degrees Celsius) air or cooler air.

In the second ultraviolet cleaning zone 140, a second ultraviolet cleaning operation may be performed (S150). The second ultraviolet cleaning operation may irradiate the mask MK with a second ultraviolet laser beam at a second irradiation angle. In one exemplary embodiment, the second ultraviolet cleaning zone 140 may include a second suction device 141 and a second ultraviolet laser device 143. The second ultraviolet laser device 143 may irradiate the deposition surface of the mask MK with the second ultraviolet laser beam having a second irradiation angle, a second irradiation direction, and a second intensity to remove organic materials deposited on the deposition surface of the mask MK. For example, the second irradiation angle may be between about 25 degrees and 90 degrees. The second suction device 141 may inhale and discharge the organic material separated from the mask MK by the second ultraviolet laser device 143.

The second ultraviolet laser beam may be adjusted to clean a region uncovered by the first ultraviolet cleaning operation. For example, at least one of the second intensity, the second irradiation angle, and the second irradiation direction may be adjusted so as to clean the region uncovered by the first ultraviolet cleaning operation. Since the region uncovered by the first ultraviolet cleaning operation is changed depending on type or size of the mask MK, the second intensity, the second irradiation angle, and the second irradiation direction may be determined in consideration of the characteristics of the mask MK. In one exemplary embodiment, the second irradiation angle may be adjusted such that the second irradiation angle symmetrical to the first irradiation angle. Thus, the second ultraviolet laser beam may symmetrical to the first ultraviolet laser beam with respect to the D2-D3 plane defined in the second direction D2 and the third direction D3. In one exemplary embodiment, a second intensity of the second ultraviolet laser beam may be smaller than a first intensity of the first ultraviolet laser beam. A durability of the mask MK can be lowered by the first ultraviolet laser beam and the second ultraviolet laser beam. Therefore, it may be beneficial to control the second intensity such that second ultraviolet laser beam has a smaller intensity in a range in which the mask MK can be sufficiently cleaned. Therefore, the second intensity can be controlled to be smaller than the first intensity, such that only the remaining organic material of the mask MK may be removed. Here, the remaining organic material of the mask MK represents material not removed by the first ultraviolet cleaning operation, for example, the remaining organic material may be less than about 30% of the total.

In the second cooling zone 150, the mask MK heated by the second ultraviolet laser beam may be cooled (S160). A temperature of the mask MK may be raised depending on the intensity of the second ultraviolet laser beam. Accordingly, it may be beneficial to cool the mask rapidly to prevent the deformation of the mask MK. In one exemplary embodiment, the second cooling zone 150 may include a third air knife 151 spraying air onto the mask MK. The third temperature of air sprayed from the third air knife 151 may be lower than the first temperature of air sprayed from the first air knife 111. For example, the third air knife 151 may spray ambient temperature (for example, about 10 degrees Celsius to 20 degrees Celsius) air or cooler air.

In the infrared cleaning zone 160, an infrared cleaning operation may be performed (S170). The infrared cleaning operation may irradiate the mask MK with an infrared laser beam at a third irradiation angle. In one exemplary embodiment, the infrared cleaning zone 160 may include a third suction device 161 and an infrared laser device 163. The infrared laser device 163 may irradiate the deposition surface of the mask MK with the infrared laser beam having a third irradiation angle, a third irradiation direction, and a third intensity to remove remaining organic materials (e.g., Lithium Fluoride (LiF)) of the mask MK not removed by the first and second ultraviolet laser beams. For example, the third irradiation angle may be between about 25 degrees and 90 degrees. The third suction device 161 may inhale and discharge the organic material separated from the mask MK by the infrared laser device 163.

In one exemplary embodiment, the mask may include a mask sheet MS and a mask frame MF. The mask sheet MS may be for forming fine patterns in a deposition process, and may be placed on the mask frame MF. The first and second irradiation directions of the first and second ultraviolet laser beams may be directed to the mask sheet MS and the third irradiation direction of the infrared laser beam may be directed to the mask frame MF. Thus, the infrared laser beam can be focused on the cleaning of the mask frame MF rather than the mask sheet MS.

In one exemplary embodiment, first through third suction devices 121, 141, 161 may be connected to a collecting device TD for collecting organic material. When the organic light emitting display device is manufactured by a deposition process in which an organic material is vaporized and deposited at a higher temperature, a magnitude of the organic material deposited on the organic light emitting display device may be less than 10% of the vaporized organic material, and the remaining organic material may be deposited on the mask MK or the like. Therefore, the first through third suction devices 121, 141, 161, may be connected to a collecting device TD for collecting organic material, thereby collecting and recycling the remaining organic material.

In the peeling zone 170, deposited organic material where the binding force has been weakened by the infrared laser beam may be peeled from a surface of the mask MK by spraying compressed air onto the mask MK (S180). In one exemplary embodiment, the peeling zone 170 may include a fourth air knife 171 spraying air onto the mask MK. The fourth air knife 171 may perform roles of cooling the mask MK heated by the infrared laser beam as well as peeling the deposited organic material. A fourth temperature of air sprayed from the fourth air knife 171 may be lower than a first temperature of air sprayed from the first air knife 111. For example, the fourth air knife 171 may spray ambient temperature air or cooler air as described above.

In one exemplary embodiment, a spray angle of the fourth air knife 171 may be smaller than each of spray angles of the first through the third air knives 111, 131, 151. Here, the spray angle represents an angle formed by air sprayed from air knife and a D1-D2 plane defined in the first direction D1 and the second direction D2. For example, each of the first through third air knives 111, 131, 151 may have the spray angle perpendicular (i.e., about 90 degrees) to the mask MK to prevent particle scattering in addition to their roles of preheating or cooling. On the other hand, the fourth air knife 171 may have the spray angle (for example, 45 degrees) at which the organic material can be efficiently peeled from the mask MK.

Therefore, the mask cleaning apparatus 100 may clean the screen mask MK for manufacturing the display device in dry cleaning manner by including the first and second ultraviolet cleaning zones 120, 140 in which the mask MK is irradiated with the ultraviolet laser beam and the infrared cleaning zone 160 in which the mask MK is irradiated with the infrared laser beam. Accordingly, the mask cleaning apparatus 100 can be implemented with a simpler structure and can reduce a cost of chemical material in comparison with a wet cleaning apparatus.

Although the exemplary embodiments of FIGS. 2A and 2B describe that the mask cleaning apparatus 100 includes the preheating zone 110, the first ultraviolet cleaning zone 120, the first cooling zone 130, the second ultraviolet cleaning zone 140, the second cooling zone 150, the infrared cleaning zone 160, and the peeling zone 170, the mask cleaning apparatus 100 may further include an additional zone for performing additional processing or exclude one or more of the foregoing zones. For example, the mask cleaning apparatus may further include a buffer zone for separating a zone for cleaning the mask sheet and a zone for cleaning the mask frame between the second cooling zone and the infrared cleaning zone.

Figure 4A:
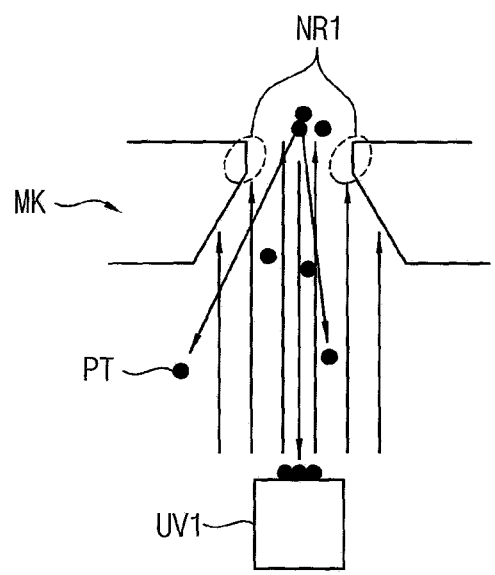
FIGS. 4A, 4B, and 4C are schematic diagrams of an effect of the mask cleaning apparatus of FIGS. 2A and 2B.
Figure 4B:
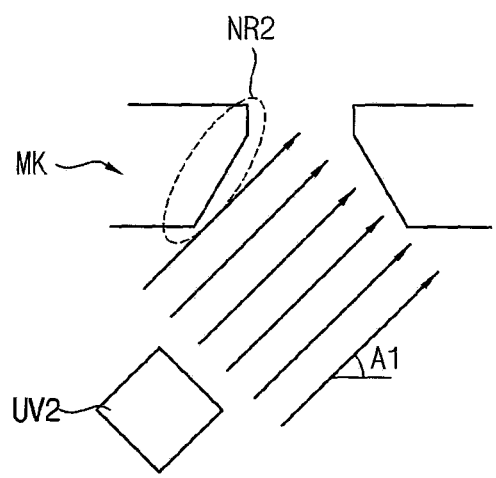
Figure 4C:
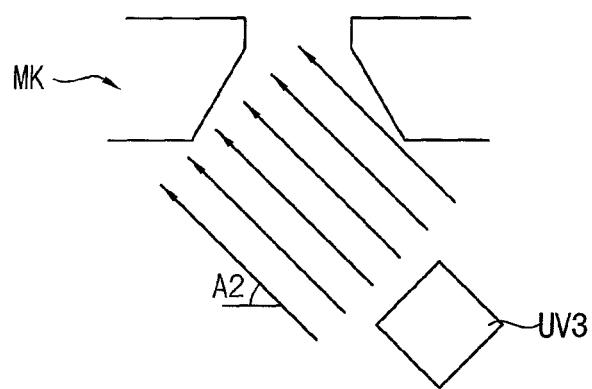

Referring to FIGS. 4A through 4C, the mask cleaning apparatus may clean the screen mask MK for manufacturing the display device in the dry cleaning manner without any untreated region by including a plurality of ultraviolet cleaning zones each irradiating ultraviolet laser beam.

As shown in FIG. 4A, in a comparative example embodiment, a comparative example mask cleaning apparatus may include single ultraviolet cleaning zone on which an ultraviolet laser device UV1 irradiates a mask MK with the ultraviolet laser beam in a direction perpendicular to the mask MK. In this case, not only does an untreated region NR1 in which the ultraviolet laser beam is not irradiated to the mask MK exist but also the ultraviolet laser apparatus UV1 is contaminated by particles PT. Thus, the comparative example mask cleaning apparatus does not remove organic material from the mask MK, adequately, and may thus have a lower cleaning ability.

As shown in FIGS. 4B and 4C, the mask cleaning apparatus may include the first and second ultraviolet cleaning zones. In the first ultraviolet cleaning zone, the first ultraviolet laser device UV2 may irradiate the mask MK with the first ultraviolet laser beam at a first irradiation angle. In the second ultraviolet cleaning zone, the second ultraviolet laser device UV3 may irradiate the mask MK with the second ultraviolet laser beam at a second irradiation angle. An untreated region NR2 to which the first ultraviolet laser beam is not irradiated and the organic material is not removed may occur. However, because the second ultraviolet laser beam is irradiated to the untreated region NR2, the untreated region NR2 can be cleaned. Here, at least one of the irradiation angle, the irradiation direction, and the intensity of the second ultraviolet laser beam may be different from the first ultraviolet laser beam. Thus, the ultraviolet laser beams having different irradiation angles or different irradiation directions may be sequentially irradiated such that the region not cleaned by the first ultraviolet laser beam is cleaned by the second ultraviolet laser beam. Accordingly, the organic material deposited on the mask MK can be efficiently removed. Where, at least one of the intensity, the irradiation angle, and the irradiation direction of the second ultraviolet laser beam may be adjusted so as to clean the region not covered by the first ultraviolet cleaning operation. For example, the second irradiation angle A2 may be adjusted to be an angle symmetrical to the first irradiation angle A1.

Figure 5A:
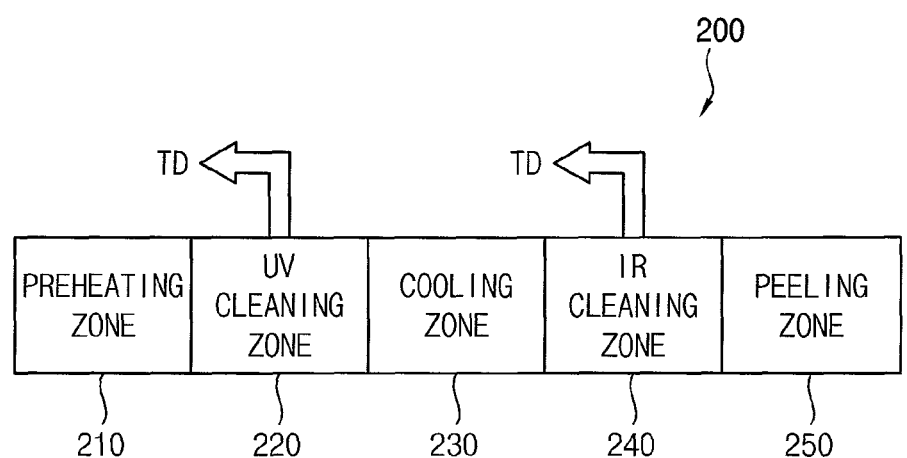
FIG. 5A is a schematic diagram of a mask cleaning apparatus according to a second exemplary embodiment.
Figure 6:
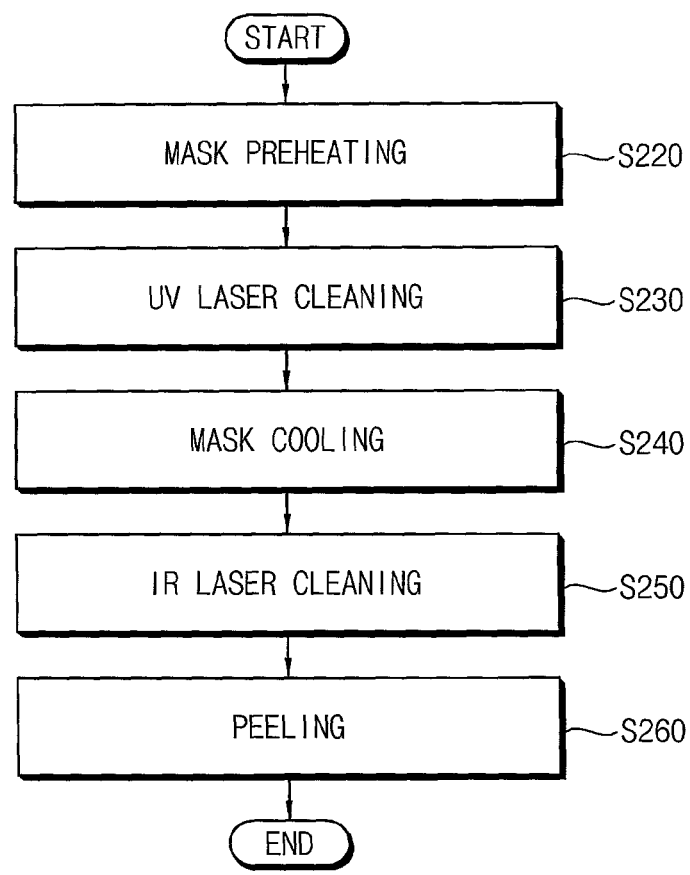
FIG. 6 is a flow chart of an example of a mask cleaning method using the mask cleaning apparatus of FIGS. 5A and 5B.

Referring to FIGS. 5A, 5B, and 6, the mask cleaning apparatus 200 may clean the mask MK in dry cleaning manner by including first ultraviolet cleaning zone 220 in which the mask is irradiated with an ultraviolet laser beam and an infrared cleaning zone 240 in which the mask is irradiated with an infrared laser beam. The mask cleaning apparatus 200 according to the present exemplary embodiment is substantially the same as the mask cleaning apparatus 100 of the exemplary embodiment described in FIGS. 2A and 2B, except that the mask cleaning apparatus 200 includes a single ultraviolet cleaning zone 220 and a single cooling zone 230. Therefore, duplicated descriptions will be omitted.

The mask cleaning apparatus 200 of the cleaning chamber CC-2 may include a preheating zone 210, an ultraviolet cleaning zone 220, a cooling zone 230, an infrared cleaning zone 240, and a peeling zone 250. The mask MK may sequentially pass through the preheating zone 210, the ultraviolet cleaning zone 220, the cooling zone 230, the infrared cleaning zone 240, and the peeling zone 250 at a constant speed (i.e., the target speed).

In the preheating zone 210, the mask MK may be preheated (S220). In one exemplary embodiment, the preheating zone 210 may include a first air knife 211 spraying air onto the mask MK. In one exemplary embodiment, a first temperature of air sprayed from the first air knife 211 may be higher than a second temperature of air sprayed from a second air knife 231 included in the cooling zone 230.

In the first ultraviolet cleaning zone 220, an ultraviolet cleaning operation may be performed (S230). The ultraviolet cleaning operation may irradiate the mask MK with an ultraviolet laser beam at a first irradiation angle. In one exemplary embodiment, the ultraviolet cleaning zone 220 may include a first suction device 221 and an ultraviolet laser device 223. The ultraviolet laser device 223 may irradiate a deposition surface of the mask MK with an ultraviolet laser beam having a first irradiation angle, a first irradiation direction, and a first intensity to remove organic materials deposited on the deposition surface of the mask MK. In one exemplary embodiment, the first irradiation angle of the ultraviolet laser beam may be perpendicular to the mask MK (i.e., about 90 degrees). Thus, the ultraviolet laser beam may be perpendicularly irradiated to the mask MK to efficiently remove organic materials deposited on the mask MK using single ultraviolet laser device and to reduce a size of the untreated region as much as possible.

In the cooling zone 230, the mask MK heated by the ultraviolet laser beam may be cooled (S240). In one exemplary embodiment, the cooling zone 230 may include a second air knife 231 spraying air onto the mask MK. The second air knife 231 may spray ambient temperature (for example, about 10 degrees Celsius to 20 degrees Celsius) air or cooler air.

In the infrared cleaning zone 240, an infrared cleaning operation may be performed (S250). The infrared cleaning operation may irradiate the mask MK with an infrared laser beam at a third irradiation angle. In one exemplary embodiment, the infrared cleaning zone 240 may include a third suction device 241 and an infrared laser device 243. For example, the third irradiation angle may be between about 25 degrees and 90 degrees.

In one exemplary embodiment, the mask may include a mask sheet MS and a mask frame MF. The irradiation directions of the ultraviolet laser beam may be directed to the mask sheet MS. The irradiation direction of the infrared laser beam may be directed to the mask frame MF.

In one exemplary embodiment, first and third suction devices 221, 241 may be connected to a collecting device TD for collecting organic material separated from the mask MK.

In the peeling zone 250, the deposited organic material with a binding force weakened by the infrared laser beam may be peeled from a surface of the mask MK by spraying compressed air onto the mask MK (S260). In one exemplary embodiment, the peeling zone 250 may include a fourth air knife 251 spraying air onto the mask MK. In one exemplary embodiment, a spray angle of the fourth air knife 251 may be smaller than each of spray angles of the first air knife 211 and the second air knife 231.

Because the ultraviolet laser device is relatively expensive, the mask cleaning apparatus 200 cleans the organic material deposited on the mask MK using single ultraviolet cleaning zone and single infrared cleaning zone to reduce manufacturing/construction costs of the mask cleaning apparatus 200 as compared to embodiments with more than one ultraviolet laser device.

Figure 7A:
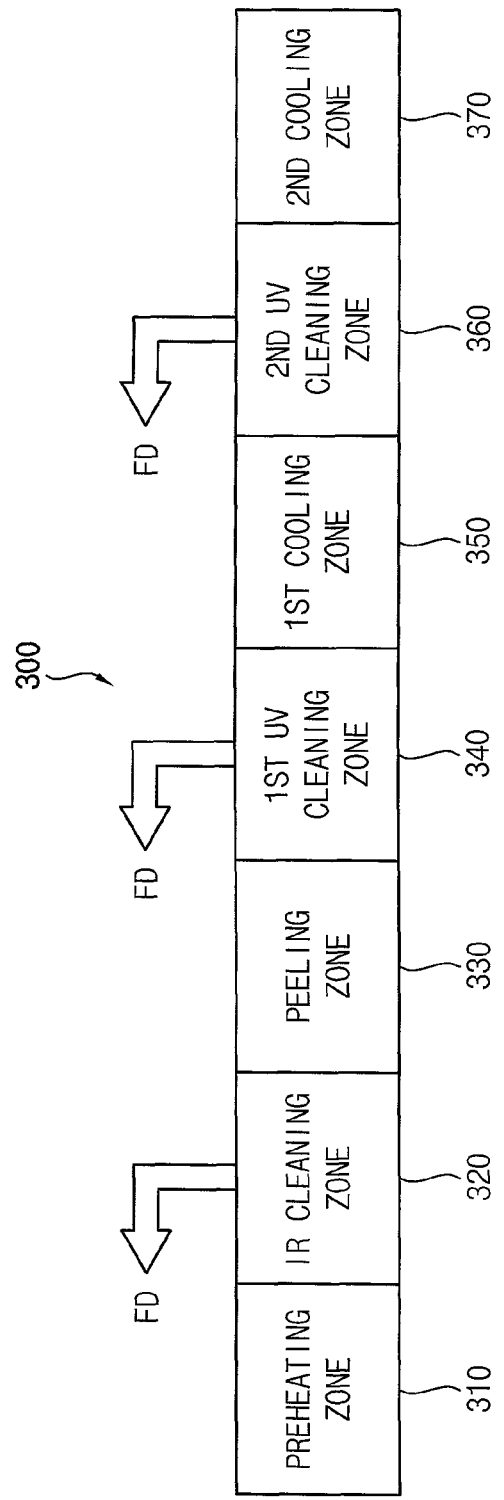
FIG. 7A is a schematic diagram of a mask cleaning apparatus according to a third exemplary embodiment.
Figure 8:
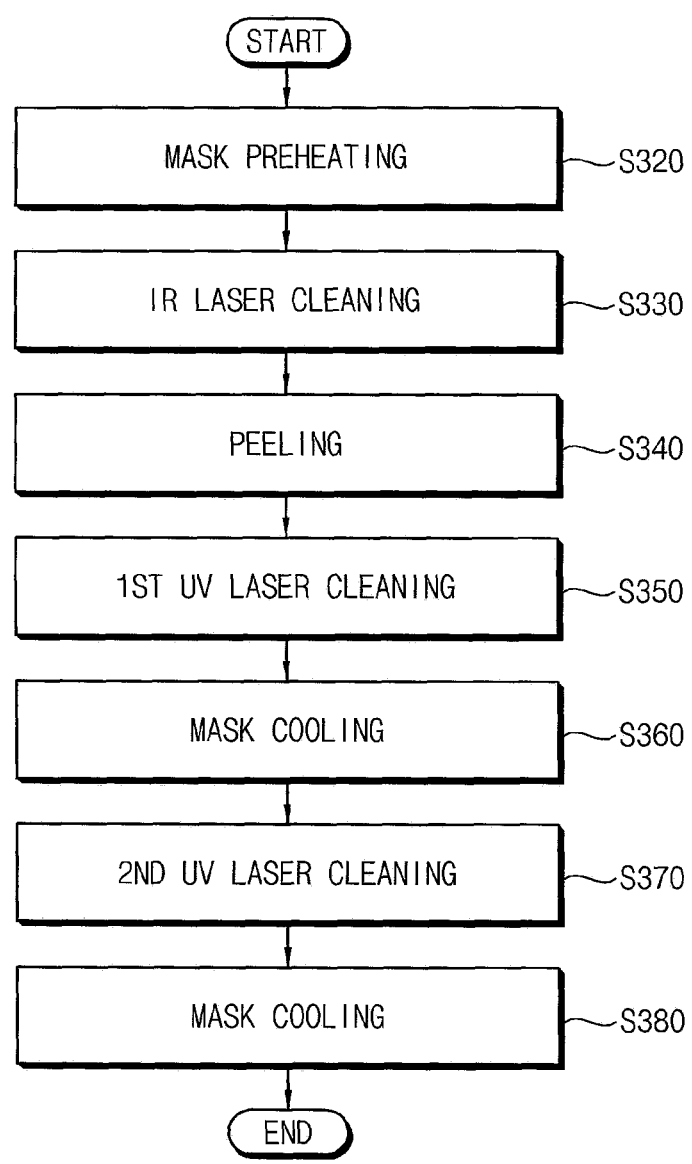
FIG. 8 is a flow chart of an example of a mask cleaning method using the mask cleaning apparatus of FIGS. 7A and 7B.

Referring to FIGS. 7A, 7B, and 8, the mask cleaning apparatus 300 may clean the mask MK in dry cleaning manner by including first and second ultraviolet cleaning zones 340, 360 in each of which the mask is irradiated with an ultraviolet laser beam and an infrared cleaning zone 320 in which the mask is irradiated with an infrared laser beam. The mask cleaning apparatus 300 according to this exemplary embodiment is substantially the same as the mask cleaning apparatus 100 of the exemplary embodiment described in FIGS. 2A and 2B, except that the mask MK passes through the infrared cleaning zone 320 ahead of the first and second ultraviolet cleaning zones 340 and 360 in the mask cleaning apparatus 300. Therefore, duplicated descriptions will be omitted.

The mask cleaning apparatus 300 of the cleaning chamber CC-3 may include a preheating zone 310, an infrared cleaning zone 320, a peeling zone 330, a first ultraviolet cleaning zone 340, a first cooling zone 350, a second ultraviolet cleaning zone 360, and a second cooling zone 370. The mask MK may sequentially pass through the preheating zone 310, the infrared cleaning zone 320, the peeling zone 330, the first ultraviolet cleaning zone 340, the first cooling zone 350, the second ultraviolet cleaning zone 360, and the second cooling zone 370 at a constant speed (i.e., the target speed).

In the preheating zone 310, the mask MK may be preheated (S320). In one exemplary embodiment, the preheating zone 310 may include a first air knife 311 spraying air onto the mask MK.

In the infrared cleaning zone 320, an infrared cleaning operation may be performed (S330). The infrared cleaning operation may irradiate the mask MK with an infrared laser beam at a third irradiation angle. For example, the third irradiation angle may be between about 25 degrees and 90 degrees. In one exemplary embodiment, the infrared cleaning zone 320 may include a third suction device 321 and an infrared laser device 323.

In the peeling zone 330, the deposited organic material with a binding force weakened by the infrared laser beam may be peeled from a surface of the mask MK by spraying compressed air onto the mask MK (S340). In one exemplary embodiment, the peeling zone 330 may include a fourth air knife 331 spraying air onto the mask MK.

In the first ultraviolet cleaning zone 340, a first ultraviolet cleaning operation may be performed (S350). The first ultraviolet cleaning operation may irradiate the mask MK with a first ultraviolet laser beam at a first irradiation angle. For example, the first irradiation angle may be between about 25 degrees and 65 degrees. In one exemplary embodiment, the first ultraviolet cleaning zone 340 may include a first suction device 341 and a first ultraviolet laser device 343.

In the first cooling zone 350, the mask MK heated by the first ultraviolet laser beam may be cooled down (S360). In one exemplary embodiment, the first cooling zone 350 may include a second air knife 351 spraying air onto the mask MK.

In the second ultraviolet cleaning zone 360, a second ultraviolet cleaning operation may be performed (S370). The second ultraviolet cleaning operation may irradiate the mask MK with a second ultraviolet laser beam at a second irradiation angle. For example, the second irradiation angle may be between about 25 degrees and 90 degrees. In one exemplary embodiment, the second ultraviolet cleaning zone 360 may include a second suction device 361 and a second ultraviolet laser device 363.

In the second cooling zone 370, the mask MK heated by the second ultraviolet laser beam may be cooled (S380). In one exemplary embodiment, the second cooling zone 370 may include a third air knife 371 spraying air onto the mask MK.

Therefore, the mask cleaning apparatus 300 can clean masks having a variety of of mask type, mask size, type of organic material, and so on, because the mask cleaning apparatus 300 cleans the mask in dry cleaning manner using two ultraviolet cleaning zones and single infrared cleaning zone.

Although a mask cleaning method and a mask cleaning apparatus for performing the method according to exemplary embodiments have been described with reference to figures, those skilled in the art will readily appreciate that many modifications are possible in the exemplary embodiments without materially departing from the novel teachings and advantages of the disclosure. For example, although the exemplary embodiments describe that the mask is for manufacturing the organic light emitting display device, a type of the mask that can be cleaned as described herein is not limited to such a mask.

The disclosure may be applied to a cleaning apparatus. For example, the disclosure may be applied to a cleaning system for cleaning an FMM mask, cleaning an open mask, and so on.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A mask cleaning apparatus, comprising:
    a preheating zone configured to preheat a mask;
    a first ultraviolet cleaning zone configured to irradiate the mask with a first ultraviolet laser beam at a first irradiation angle;
    a first cooling zone configured to cool the mask irradiated with the first ultraviolet laser beam;
    a second ultraviolet cleaning zone configured to irradiate the mask with a second ultraviolet laser beam at a second irradiation angle;
    a second cooling zone configured to cool the mask irradiated with the second ultraviolet laser beam;
    an infrared cleaning zone configured to irradiate the mask with an infrared laser beam at a third irradiation angle; and
    a peeling zone configured to spray air onto the mask irradiated with the infrared laser beam,
    wherein:
    the preheating zone includes a first air knife configured to spray air onto the mask;
    the first cooling zone includes a second air knife configured to spray air onto the mask;
    the second cooling zone includes a third air knife configured to spray air onto the mask; and
    the first air knife, the second air knife, and the third air knife are configured such that a first temperature of air sprayed from the first air knife is higher than a second temperature of air sprayed from the second air knife and a third temperature of air sprayed from the third air knife.

2. The mask cleaning apparatus of claim 1, wherein the mask cleaning apparatus is configured such that the mask sequentially passes through the preheating zone, the first ultraviolet cleaning zone, the first cooling zone, the second ultraviolet cleaning zone, the second cooling zone, the infrared cleaning zone, and the peeling zone at a constant speed.

3. The mask cleaning apparatus of claim 1, wherein the first irradiation angle and the second irradiation angle are symmetrical to each other.

4. The mask cleaning apparatus of claim 1, wherein the mask cleaning apparatus is configured such that at least one of intensity, irradiation angle, and irradiation direction of the second ultraviolet laser beam is adjusted based on a characteristic of the mask.

5. The mask cleaning apparatus of claim 1, wherein the mask cleaning apparatus is configured such that an intensity of the second ultraviolet laser beam is smaller than an intensity of the first ultraviolet laser beam.

6. The mask cleaning apparatus of claim 1, wherein the peeling zone includes a fourth air knife configured to spray air onto the mask, and
    wherein a spray angle of the fourth air knife is smaller than spray angles of the first air knife, the second air knife, and the third air knife.

7. The mask cleaning apparatus of claim 1, wherein each of the first ultraviolet cleaning zone, the second ultraviolet cleaning zone, and the infrared cleaning zone includes a suction device.

8. The mask cleaning apparatus of claim 7, wherein the suction device is connected to a collecting device for collecting organic material.

9. The mask cleaning apparatus of claim 1, wherein the mask includes a mask sheet and a mask frame,
    wherein each of irradiation directions of the first and second ultraviolet laser beams is determined based on a position of the mask sheet, and
    wherein an irradiation direction of the infrared laser beam is determined based on a position of the mask frame.

10. A mask cleaning method. comprising:
    preheating a mask using a first air knife;
    irradiating the mask with a first ultraviolet laser beam at a first irradiation angle;
    cooling the mask using a second air knife;
    irradiating the mask with a second ultraviolet laser beam at a second irradiation angle;
    cooling the mask using a third air knife;
    irradiating the mask with an infrared laser beam at a third irradiation angle; and
    spraying air onto the mask using a fourth air knife.

11. The mask cleaning method of claim 10, wherein the first irradiation angle and the second irradiation angle are symmetrical to each other.

12. The mask cleaning method of claim 10, wherein an intensity of the second ultraviolet laser beam is smaller than an intensity of the first ultraviolet laser beam.

13. The mask cleaning method of claim 10, wherein a spray angle of the fourth air knife is smaller than spray angles of the first air knife, the second air knife, and the third air knife.

14. The mask cleaning method of claim 10, wherein a temperature of air sprayed from the first air knife is higher than a temperature of air sprayed from the second air knife and a temperature of air sprayed from the third air knife.

* * * * *